United States Patent [19]

Fraser et al.

[11] 4,244,799

[45] Jan. 13, 1981

[54] FABRICATION OF INTEGRATED CIRCUITS UTILIZING THICK HIGH-RESOLUTION PATTERNS

[75] Inventors: David B. Fraser, Berkeley Heights; Dan Maydan, Short Hills; Joseph M. Moran, Berkeley Heights, all of N.J.

[73] Assignee: Bell Telephone Laboratories, Incorporated, Murray Hill, N.J.

[21] Appl. No.: 941,369

[22] Filed: Sep. 11, 1978

[51] Int. Cl.³ .......................................... H01L 21/312
[52] U.S. Cl. ........................ 204/192 E; 204/192 EC;
156/643; 156/656; 156/657; 156/659.1
[58] Field of Search .................... 204/192 EC, 192 E;
156/643, 661, 646, 652, 656, 657, 659, 660;
427/43

[56] References Cited

U.S. PATENT DOCUMENTS

| | | | |
|---|---|---|---|
| 3,700,497 | 10/1972 | Epifano et al. | 156/659 X |
| 3,867,216 | 2/1975 | Jacob | 204/192 E |
| 3,873,361 | 3/1975 | Franco et al. | 204/192 EC |
| 3,962,004 | 6/1976 | Sonneborn | 156/661 X |
| 3,985,597 | 10/1976 | Zielinski | 204/192 X |
| 4,004,044 | 1/1977 | Franco et al. | 204/192 EC |
| 4,024,041 | 5/1977 | Hanazono et al. | 204/192 E |
| 4,025,411 | 5/1977 | Hom-ma et al. | 204/192 E |
| 4,070,501 | 1/1978 | Corbin et al. | 204/192 EC |
| 4,089,766 | 5/1978 | Paal et al. | 204/192 EC |
| 4,092,442 | 5/1978 | Agnihotri et al. | 427/41 |

OTHER PUBLICATIONS

J. L. Vossen and W. Kern, Editors, Thin Film Processes, Academic Press, New York, 1978, pp. 497–498, 537–545.

*Primary Examiner*—Howard S. Williams
*Assistant Examiner*—William Leader
*Attorney, Agent, or Firm*—Lucian C. Canepa

[57] ABSTRACT

In an integrated circuit fabrication sequence, a relatively thick sacrificial layer (18) is deposited on a nonplanar surface of a device wafer in which high-resolution features are to be defined. The thick layer is characterized by a conforming lower surface and an essentially planar top surface and by the capability of being patterned in a high-resolution way. An intermediate masking layer (22) and then a thin resist layer (20) are deposited on the top surface of the sacrificial layer, the thickness of the resist layer being insufficient by itself to provide adequate step coverage if the resist layer were applied directly on the nonplanar surface. A high-resolution pattern defined in the resist layer is transferred into the intermediate masking layer. Subsequently, a dry processing technique is utilized to replicate the pattern in the sacrificial layer. A high-resolution pattern with near-vertical sidewalls is thereby produced in the sacrificial layer. By means of the patterned sacrificial layer, high-resolution features are then defined in the underlying nonplanar surface.

14 Claims, 5 Drawing Figures

FABRICATION OF INTEGRATED CIRCUITS UTILIZING THICK HIGH-RESOLUTION PATTERNS

BACKGROUND OF THE INVENTION

This invention relates to device lithography and, more particularly, to the fabrication of integrated circuits utilizing thick high-resolution patterns.

Providing adequate step coverage in lithographic processes designed to make high-resolution integrated circuits is a vexing problem. High resolution implies utilizing very thin layers of resist for pattern delineation on the surface of a device wafer being processed. But to achieve satisfactory coverage over steps on a nonplanar surface of such a device, the resist layer must as a practical matter be made thicker than is dictated by resolution considerations alone. Thus, the resist layer thickness utilized in actual fabrication processes is usually thicker than would be specified if resolution were the only factor to be considered but thinner than if absolutely reliable step coverage were the sole consideration.

Moreover, a relatively thin resist layer applied to a nonplanar surface typically exhibits a variable thickness. In turn, patterning such a layer usually results in device feature geometries whose sizes vary as a function of resist thickness. Such feature or linewidth changes may lead to geometrical variations that are sufficiently serious to cause defects or at least less-than-optimal performance in the device being fabricated. Thus, good feature or linewidth control is obviously an important desideratum of a reliable high-yield integrated circuit fabrication process.

As the trend toward large-scale and very-large-scale integrated circuits has continued, considerable effort has been directed at trying to devise improved fine-line patterning techniques characterized by high resolution, good step coverage and good linewidth control. It was recognized that such techniques, if available, would improve the results obtainable with available lithographic systems and thereby lower the cost and improve the performance of integrated circuits made thereby.

SUMMARY OF THE INVENTION

In accordance with the principles of the present invention, a unique integrated circuit fabrication sequence is provided. A relatively thick sacrificial layer is deposited on a nonplanar surface of a device wafer in which high-resolution features are to be defined. The thick layer is characterized by a conforming lower surface and an essentially planar top surface and by the capability of being patterned in a high-resolution way with good linewidth control. In accordance with one specific aspect of the invention, an intermediate masking layer and then a thin and uniform resist layer are deposited on the top surface of the sacrificial layer, the thickness of the resist layer being insufficient by itself to provide adequate step coverage if the resist layer were applied directly on the nonplanar surface. A high-resolution pattern defined in the resist layer is transferred into the intermediate masking layer. Subsequently, a dry processing technique is utilized to replicate the pattern in the sacrificial layer. A high-resolution pattern with near-vertical sidewalls and excellent linewidth control is thereby produced in the sacrificial layer. By means of the patterned sacrificial layer, high-resolution features are then defined in the underlying nonplanar surface.

More specifically, applicants' invention comprises a method of fabricating integrated circuits comprising the steps of (1) applying to a device wafer that exhibits a nonplanar surface a relatively thick sacrificial layer that is characterized by a conforming lower surface and an essentially planar top surface and by the capability of being patterned in a high-resolution way with excellent linewidth control, (2) applying an intermediate masking layer to the top surface of the sacrificial layer, (3) applying a relatively thin resist layer on top of the masking layer, (4) processing the resist layer to define therein a high-resolution pattern, (5) processing the intermediate masking layer to transfer the high-resolution pattern therein, (6) processing the sacrificial layer to transfer the high-resolution pattern therein, and (7) processing the nonplanar surface of the device wafer utilizing the patterned sacrificial layer as a mask therefor.

In accordance with other aspects of the principles of applicants' invention, the intermediate masking layer is omitted. In that case, only a relatively thin layer to be patterned is applied to the top surface of the relatively thick sacrificial layer. The thin layer is selected to be made of a material that exhibits good resistance to the etching technique employed to pattern the sacrificial layer.

In accordance with still another aspect of the principles of this invention, the thick patterned sacrificial layer is employed as a masking layer for electroplating a metal onto exposed regions of a thin metallic layer. In that way, a relatively thick metallic pattern (useful, for example, as the x-ray-absorbing elements of an x-ray mask structure) may be formed.

In accordance with a still further aspect of the principles of this invention, a thick sacrificial layer on a planar surface is patterned in a high-resolution way and then utilized as a masking layer for, for example, ion implantation purposes.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
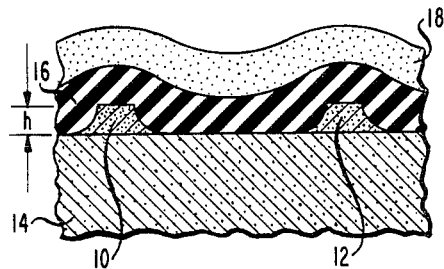
FIG. 1 is a cross-sectional side view of a portion of a standard integrated circuit device and is illustrative of the manner in which the surface of such a device is patterned utilizing conventional prior art techniques.

In FIG. 1 a portion of a standard integrated circuit device is schematically depicted. The illustrative device includes two conductive elements 10 and 12 disposed on a substrate 14. Herein, for purposes of a specific example only, the elements 10 and 12 will be assumed to be made of doped polysilicon and the substrate 14 will be assumed to be made of silicon. Deposited on the top surface of the substrate 14 and covering the elements 10 and 12 is a conventional passivating layer 16 of phosphorus glass.

In accordance with standard steps of a known device fabrication sequence, openings or windows are formed in the layer 16 of FIG. 1 in aligned registry with the conductive elements 10 and 12. A conductive material such as aluminum is then deposited on the top surface of the device and in the aligned windows to establish electrical connections to the underlying elements 10 and 12.

As is well known in the art, the aforespecified windows in the layer 16 may be formed by depositing a radiation-sensitive resist layer 18 on the layer 16. By standard patterning techniques, openings are made in the resist layer 18 directly overlying the windows to be formed in the passivating layer 16. Then, using the patterned resist as a masking layer, the desired windows are formed in the layer 16 by, for example, standard etching techniques.

In one actual device embodiment, the steeply stepped elements 10 and 12 of FIG. 1 each have a vertical height h above the top of the substrate 14 of approximately one micrometer ($\mu$m). As a result of the irregular topology introduced by the elements 10 and 12, the overlying layer 16 typically exhibits a nonplanar top surface and a variable thickness. Similarly, the resist layer 18 also has a variable thickness. In addition, as discussed earlier above, the layer 18 must as a practical matter be designed thicker than desired thereby to insure adequate step coverage over contours in the nonplanar top surface of the passivating layer 16. Consequently, it has been found in practice that a microminiature device made by techniques of the type represented in FIG. 1 often does not possess adequate resolution and linewidth control to meet stringent requirements specified for certain categories of large-scale and very-large-scale integrated circuit devices.

To illustrate the applicability of applicants' inventive principles to the fabrication of integrated circuit devices, a particular device structure of the same type as that depicted in FIG. 1 will be assumed. It will be apparent though that these principles are general purpose in nature and thus applicable to making a wide variety of integrated circuit, as well as discrete, devices. Moreover, although primary emphasis herein is on fabricating silicon devices, it is obvious that these principles are also applicable to various known magnetic devices, integrated-optics devices, etc.

Figure 2:
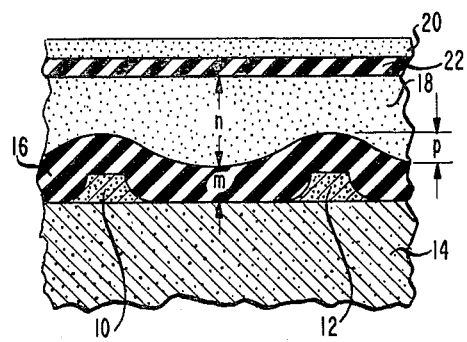
FIG. 2 is a cross-sectional side view of a portion of an integrated circuit device whose surface is to be processed in accordance with aspects of the principles of the present invention.

As in FIG. 1, each of FIGS. 2 through 5 shows a portion of a specific illustrative device structure having a substrate 14, conductive elements 10 and 12 and a passivating layer 16. In accordance with the principles of the present invention, a relativvely thick sacrificial layer is applied to the top nonplanar surface of the layer 16. As indicated in FIG. 2, this thick layer (designated by reference numeral 18) has a bottom surface that conforms to the contours of the top surface of the layer 16. But in practice, in accordance with the specific teachings set forth in detail below, the top surface of the thick layer 18 can be accurately and reproducibly controlled to be essentially flat. Accordingly, a basis is provided for depositing an extremely thin and uniform layer to be patterned on top of the essentially flat surface. Step coverage considerations are thereby virtually removed as a factor in selecting the thickness of the layer to be patterned. In that way, very-high-resolution patterning, with excellent linewidth control, is achieved.

In FIG. 2 the aforementioned thin layer to be patterned is designated by reference numeral 20. In accordance with one specific aspect of the principles of the present invention, a so-called intermediate masking layer 22 is interposed between the layers 18 and 20. But, in appropriate circumstances, which will be specified later below, the layer 22 may be omitted. In that case, of course, the layer 20 is applied directly to the essentially flat top surface of the sacrificial layer 18. For now, the layer 22 will be assumed to be included in the depicted structure.

In accordance with the principles of the present invention, the thin layer 20 shown in FIG. 2 comprises a positive or negative resist material that can be selectively patterned by, for example, directing light, electrons, x-rays or ions thereat. A wide variety of such materials are well known in the art. Many standard techniques are available for selectively exposing and developing these materials to form a specified high-resolution pattern in the layer 20.

In accordance with the principles of this invention, the sacrificial layer 18 shown in FIG. 2 comprises an organic material capable of conforming and adhering to the nonplanar top surface of the passivating layer 16. Advantageously, this material is applied on top of the layer 16 by standard spinning techniques. In practice, it has been found that as the thickness of such a spun layer 18 is increased, the degree of flatness of the top surface thereof increases.

In one specific illustrative embodiment of the principles of the present invention, wherein each of the elements 10 and 12 of FIG. 2 had a height h of one $\mu$m and the layer 16 had a thickness m of one $\mu$m, the layer 18 constituted a spun-on layer of a novalac-resin positive photoresist having a thickness n of approximately 2.6 $\mu$m. In one such particular case, the maximum variation between peaks and valleys in the top surface of the layer 18 was measured to be only about 1000 Angstrom units (A). Herein, such a surface will be termed essentially flat. By contrast, the corresponding variation p in the top nonplanar surface of the layer 16 was measured to be about one $\mu$m.

In accordance with the present invention, a variety of organic materials characterized by ease of application (spinning, spraying, etc.) and good adhesion to the underlying surface are suitable for forming the sacrificial layer 18 shown in FIG. 2. The material selected for the sacrificial layer should advantageously be respectively resistant or susceptible to the several processing techniques specified later below. Moreover, for use in a photolithographic fabrication sequence, it is advantageous that the material of the layer 18 be highly absorptive of the light utilized to selectively expose the overlying resist layer 20. In addition, it is often advantageous in such a sequence that the layer 18 have an index of refraction that closely matches those of the layers 20 and 22. In that way, the common problems of standing waves and scattering in photolithography are minimized. Further, for use in electron-beam and x-ray lithography, it is advantageous that the layers 18 and 22 be low-electron-scattering materials thereby to minimize proximity effects in the overlying resist material.

In accordance with the principles of the present invention, a number of available organic materials are suitable for forming the sacrificial layer 18 of FIG. 2. Such materials include a variety of known positive and negative resists such as, for example: standard novalac resins, polymethyl methacrylates, poly (2,3-dichloro-1- propyl acrylate), poly (glycidyl methacrylate-co-ethyl acrylate), combinations of the two last-specified materials and other poly isoprenes, materials of the type described in U.S. Pat. No. 3,201,239 or U.S. Pat. No. 3,770,433, and Hunt HPR-104 which is commercially available from Phillip A. Hunt Chemical Corporation, Palisades Park, N.J. In addition, a variety of known polymides such as Kapton (which is a registered trademark of E. I. duPont de Nemours and Co.) or pyralin are suitable for forming the layer 18. Other such suitable materials include standard epoxy groups.

In one specific illustrative embodiment of the principles of the present invention, the structure shown in FIG. 2 comprises a one-$\mu$m-thick layer 20 made of poly(2,3-dichloro-1-propyl acrylate) (a negative x-ray resist), a 1500-A-thick layer 22 of silicon dioxide and a 2.6-$\mu$m-thick layer of a standard novalac-resin positive photoresist. In that particular embodiment, the layer 18 is characterized by an essentially flat top surface (maximum peak-to-valley height of 1000 A). The top surface of the layer 22 is similarly flat. As a result, the overlying thin resist layer 20 exhibits a substantially uniform thickness.

Figure 3:
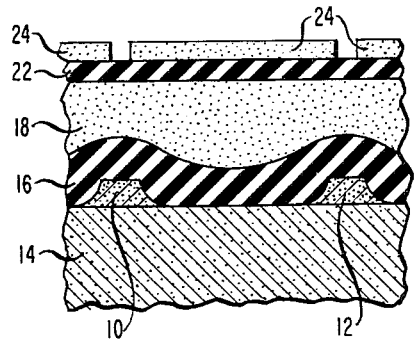
FIGS. 3 through 5 show successive views of the FIG. 2 arrangement as it is processed in accordance with the teachings of this invention.

Patterning of the layer 20 of FIG. 2 is done by conventional lithographic techniques. For the case wherein the layer 20 is made of an x-ray resist material, patterning is carried out by means of a known x-ray exposure tool. After being exposed and developed in standard ways, the patterned layer 20 typically exhibits a reduced uniform thickness. The remaining portions of the layer 20, comprising a specified pattern, are shown in FIG. 3. Each such portion is designated by reference numeral 24.

Figure 4:
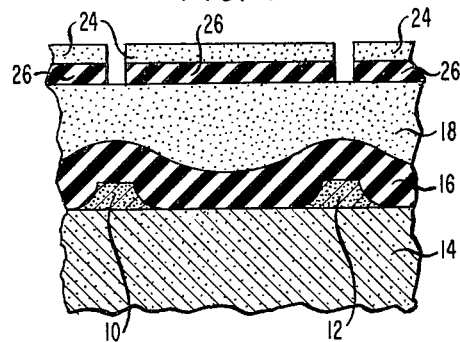

Subsequently, using the portions 24 of FIG. 3 as a mask, the layer 22 is correspondingly patterned. In accordance with one aspect of the principles of the present invention, this patterning is advantageously (but not necessarily) done by one of several techniques each of which achieves near-vertical walls and substantially no undercutting in the layer being patterned. Accordingly, the resulting pattern in the layer 22 conforms substantially exactly to that originally formed in the resist layer 20. The remaining conforming portions of the layer 22 are shown in FIG. 4 wherein each such portion is designated by reference numeral 26.

Patterning of the layer 22 (FIG. 3) may be carried out, for example, by a reactive sputter etching process of the type described in "Profile Control by Reactive Sputter Etching," by H. W. Lehmann and R. Widmer, *Journal of Vacuum Science and Technology*, pages 319–326, March/April 1978. Alternatively, the layer 22 may be plasma etched in accordance, for example, with the process described in a commonly assigned copending application of W. R. Harshbarger, H. J. Levinstein, C. J. Mogab and R. A. Porter, Ser. No. 929,549, filed July 31, 1978. In accordance with the Harshbarger et al. technique, etching is based on establishing a plasma that contains both recombination centers and active etchant species. In a selectively controllable way, recombination centers effectively terminate etchant species lifetime in the immediate vicinity of etched walls, thus providing a means for precisely controlling etching and anisotropy.

Other known dry processing techniques characterized by controllable etching anisotropy may be utilized for patterning the layer 22 of FIG. 3. The relative etching rates of the layer 22 and the overlying masking regions 24 will be an important consideration in selecting an appropriate technique for patterning a particular combination of materials.

Moreover, although it may in some cases be particularly advantageous to utilize a dry processing technique characterized by anisotropy to pattern the layer 22, it should be recognized that it is also feasible to employ isotropic techniques such as standard wet processing techniques therefor.

Next, using the patterned portions shown in FIG. 4 as a mask, the thick sacrificial layer 18 is correspondingly patterned. In accordance with aspects of the principles of the present invention, patterning of the layer 18 is advantageously carried out by, for example, ion milling, sputter etching or reactive sputter etching, which dry processes are specified in detail below. Significantly, applicants found that such processes are capable of patterning thick organic layers of the type described herein to achieve near-vertical walls while substantially avoiding undercutting therein.

As indicated above, the sacrificial layer 18 shown in FIG. 4 may be ion milled. This may be done in a standard ion milling apparatus utilizing, for example, an inert or substantially inert atmosphere of argon, helium, krypton, neon, xenon or nitrogen at a pressure in the range 1 to 100 $\mu$m at an operating voltage in the range 50 to 2000 volts. Alternatively, the layer 18 may be sputter etched utilizing, for example, an inert or substantially inert atmosphere of argon, helium, krypton, neon, xenon or nitrogen at a pressure in the range 1 to 100 $\mu$m in an apparatus in which an asymmetrical dark space is established. This last-stated requirement minimizes contamination in the sputter etching apparatus during the etching process and insures that a sufficient ion-accelerating voltage is established in the apparatus between the plasma therein and the cathode on which the devices being processed are mounted.

In addition, the layer 18 of FIG. 4 may be patterned by reactive sputter etching in, for example, an atmosphere including a halocarbon such as carbon tetrafluoride and/or oxygen at a pressure in the range of 1 to 100 $\mu$m in an apparatus in which an asymmetrical dark space is established.

During the course of etching or milling the sacrificial layer 18 of FIG. 4, the patterned resist portions 24 are removed. By contrast, the patterned portions 26 are highly resistant to the aforespecified dry processing techniques and, accordingly, remain in place substantially unaffected. In one specific illustrative case in which the intermediate masking layer 22 originally comprised a 1200-A-thick layer of plasma-deposited silicon dioxide, the thickness loss of the patterned portions 26 of the masking layer during sputter etching of the sacrificial layer 18 was less than 200 A.

Figure 5:
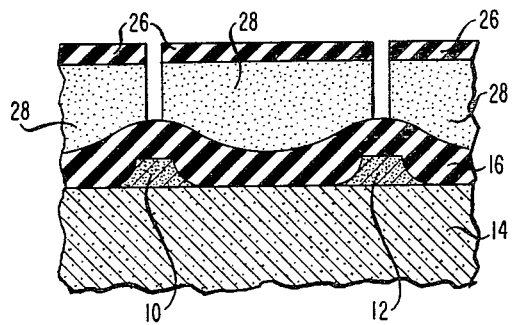

In accordance with the techniques described above, the masked sacrificial layer 18 of FIG. 4 is processed to form therein a pattern that corresponds to the pattern defined by the portions 26 of the intermediate masking layer. The remaining patterned portions of the layer 18 are shown in FIG. 5 and designated by reference numeral 28. It is significant that the trenches or grooves formed in the sacrificial layer to establish the prescribed pattern therein are characterized by near-vertical walls and substantially no undercutting. Importantly, the pattern formed in the thick layer 18 conforms substantially identically to the high-resolution pattern originally formed in the thin layer 20.

By using the patterned portions 28 (FIG. 5) as a mask, the layer 16 of the integrated circuit device being fabricated is then processed to form windows therethrough in alignment with the conductive elements 10 and 12, as described earlier above. This is done, for example, in a standard plasma etching step.

It is apparent that the particular window-forming sequence above is only illustrative of the applicability of the principles of the present invention to fabricating integrated circuit devices. By means of the thick patterned portions 28 shown in FIG. 5, it is also, of course, feasible to treat exposed underlying regions of a device surface in accordance with a variety of standard fabrication processes (such as deposition, diffusion, etching, implantation, etc.)

After the patterned portions 28 (FIG. 5) have been utilized as a mask in the illustrative ways specified above, it is customary to remove the portions 28 from the surface of the device being fabricated. This is done, for example, by applying a suitable solvent to the structure depicted in FIG. 5 or by processing the structure in a plasma etching step in an oxygen atmosphere. In either case, the portions 28 and the overlying portions 26 are thereby removed. The device is then ready for another step in its prescribed fabrication sequence, which may include further processing by means of a patterned sacrificial layer in accordance with the principles of the present invention.

In some cases of practical interest, it has been observed that the presence of metals in the chamber in which dry processing of the sacrificial layer 18 is carried out causes so-called texturing (metallic oxide fibers) to occur on the device surface. The formation of such fibers can be prevented by avoiding the use of any exposed metallic surfaces in the processing chamber. This dictates, for example, that a nonmetallic material (such as the aforespecified silicon dioxide, or boron nitride or silicon nitride or glass) be utilized for the intermediate masking layer 22. (The term "glass" as employed herein includes, for example, a variety of spun-on liquid glasses, silica films, glass resins and spun-on oxides which are essentially $Ta_2O_5$ or $TiO_2$.)

In accordance with the principles of the present invention, the intermediate masking layer 22 may in some cases be omitted altogether. This is feasible whenever the materials utilized to form the thin resist layer 20 and the thick sacrificial layer 18 exhibit relatively high and low resistance, respectively, to the particular dry processing technique employed to pattern the layer 18. Thus, for example, a 0.5 μm-thick layer 20 of a silver halide emulsion can serve, when patterned, as a mask for ion milling or sputter etching a corresponding pattern in the layer 18.

Finally, it is to be understood that the above-described arrangements and techniques are only illustrative of the principles of the present invention. In accordance with those principles, numerous modifications and alternatives may be devised by those skilled in the art without departing from the spirit and scope of the invention. For example, although emphasis herein has been directed to applying applicants' inventive principles to the direct fabrication of integrated circuit devices, it is to be understood that those principles are also applicable to the fabrication of high-resolution mask structures which, in turn, are used to make integrated circuit devices. Thus, illustratively, it is feasible to form patterned regions (such as those designated 26 and 28 in FIG. 5) on an essentially flat 0.02-μm-thick film of gold which is deposited on top of a 0.01-μm-thick layer of titanium supported on a planar polymide film. Then, by using the patterned regions as a mask, a relatively thick layer of gold can be electroplated onto the exposed regions of the gold film. In that way, high-resolution gold elements definitive of a prescribed mask structure are formed for use, for example, in an x-ray lithographic system.

Moreover, in accordance with aspects of the principles of the present invention, a thick patterned sacrificial layer on a planar surface may be utilized as a masking layer for, for example, ion implantation purposes.

We claim:

1. A method of processing nonplanar surface portions of a structure in a high-resolution way with good linewidth control, said method comprising utilizing a relatively thin uniform-thickness layer (20) of material and establishing a pattern therein definitive of the pattern in accordance with which the surface of said structure is to be processed, said relatively thin layer being insufficient by itself to provide step coverage and a uniform thickness layer if said relatively thin layer were applied directly on the nonplanar surface, characterized in that said method comprises prior to depositing and patterning said relatively thin layer, forming a relatively thick sacrificial layer (18) of material on the nonplanar surface of said structure, said sacrificial layer exhibiting a conforming lower surface and an essentially planar upper surface, said relatively thin layer being deposited on said essentially planar surface, processing said relatively thick layer employing the relatively thin patterned layer as a mask to form in said relatively thick layer a pattern having near-vertical walls and substantially no undercutting, said near-vertical walls extending through the entire thickness of said relatively thick layer, which pattern in said relatively thick layer corresponds substantially exactly to the pattern in said relatively thin layer, processing the surface of said structure utilizing said relatively thick patterned layer as a mask therefore, and removing said relatively thick patterned layer from the surface of said structure after the surface has been processed.

2. A method as in claim 1 wherein said relatively thin layer is made of a radiation-sensitive material that is relatively resistant to the processing technique utilized to pattern said relatively thick layer.

3. A method as in claim 2 wherein said relatively thick layer is made of an organic material that is dry processable to achieve therein near-vertical walls with substantially no undercutting.

4. A method as in claim 3 wherein said organic layer is patterned by ion milling.

5. A method as in claim 3 wherein said organic layer is patterned by sputter etching.

6. A method as in claim 3 wherein said organic layer is patterned by reactive sputter etching.

7. A method of fabricating integrated circuits comprising the steps of applying to the nonplanar surface of a device wafer a relatively thick sacrificial layer that is characterized by a conforming lower surface and an essentially planar top surface and by the capability of being patterned in a high-resolution way, by utilizing an overlying relatively thin mask definitive of a prescribed high-resolution pattern, processing said sacrificial layer to transfer said high-resolution pattern substantially exactly therein, said pattern in said sacrificial layer comprising through portions whose widths correspond substantially exactly to the respective widths of an overlying through portions defined in said relatively thin mask, said relatively thin mask being insufficient by itself to provide step coverage and a uniform thickness layer if said relatively thin mask were formed directly on said nonplanar surface, processing the surface of said device wafer utilizing said patterned sacrificial layer as a mask therefor, and removing said relatively thick patterned layer from the surface of said device after the surface has been processed.

8. A method of fabricating integrated circuits comprising the steps of applying to the nonplanar surface of a device wafer a relatively thick sacrificial layer (18) that is characterized by a conforming lower surface and an essentially planar top surface and by the capability of being patterned in a high-resolution way, applying an intermediate masking layer (22) to the top surface of said sacrificial layer, applying a relatively thin resist layer (20) on top of said masking layer, said relatively thin resist layer being insufficient by itself to provide step coverage and a uniform thickness layer if said relatively thin resist layer were applied directly on said nonplanar surface, processing said resist layer to define therein a high-resolution pattern, processing said intermediate masking layer to define said high-resolution pattern substantially exactly therein, processing said sacrificial layer to define said high-resolution pattern substantially exactly therein, said pattern in said sacrificial layer comprising through portions whose widths correspond substantially exactly to the respective widths of overlying aligned through portions defined in said resist layer and in said intermediate masking layer, processing the surface of said device wafer utilizing said patterned sacrificial layer as a mask therefor, and removing said relatively thick patterned sacrificial layer from the surface of said device after the surface has been processed.

9. A method as in claim 8 wherein said intermediate masking layer is made of a material selected from the group consisting of silicon dioxide, boron nitride, silicon nitride and glass.

10. A method as in claim 9 wherein said intermediate masking layer is patterned by etching in a plasma that is characterized by recombination centers as well as active etchant species.

11. A method as in claim 9 wherein said intermediate masking layer is patterned by reactive sputter etching.

12. A method as in claims 10 or 11 wherein said sacrificial layer is made of an organic material and is patterned by ion milling.

13. A method as in claims 10 or 11 wherein said sacrificial layer is made of an organic material and is patterned by sputter etching.

14. A method as in claims 10 or 11 wherein said sacrificial layer is made of an organic material and is patterned by reactive sputter etching.

* * * * *